(12) United States Patent
Buckley et al.

(10) Patent No.: US 7,731,860 B2
(45) Date of Patent: Jun. 8, 2010

(54) ION BEAM METHOD FOR REMOVING AN ORGANIC LIGHT EMITTING MATERIAL

(75) Inventors: Alastair Robert Buckley, Sheffield (GB); Georg Karl Herman Bodammer, Edinburgh (GB); Carsten Giebeler, Edinburgh (GB)

(73) Assignee: Microemissive Displays Limited, Edinburgh (GB)

( * ) Notice: Subject to any disclaimer, the term of this patent is extended or adjusted under 35 U.S.C. 154(b) by 771 days.

(21) Appl. No.: 10/551,647

(22) PCT Filed: Apr. 2, 2004

(86) PCT No.: PCT/GB2004/001471

§ 371 (c)(1), (2), (4) Date: Nov. 27, 2006

(87) PCT Pub. No.: WO2004/088764

PCT Pub. Date: Oct. 14, 2004

(65) Prior Publication Data

US 2007/0077368 A1 Apr. 5, 2007

(30) Foreign Application Priority Data

Apr. 3, 2003 (GB) ................................ 0307746.8

(51) Int. Cl.
*C23C 14/02* (2006.01)
*C03C 15/00* (2006.01)
*C23F 1/00* (2006.01)
(52) U.S. Cl. ............................. 216/24; 216/41; 216/45; 216/48; 216/66
(58) Field of Classification Search ........................ None
See application file for complete search history.

(56) References Cited

U.S. PATENT DOCUMENTS

| 4,233,109 | A | | 11/1980 | Nishizawa |
| 4,233,573 | A | * | 11/1980 | Grudkowski ............ 331/107 A |
| 4,371,412 | A | | 2/1983 | Nishizawa |
| 4,919,749 | A | * | 4/1990 | Mauger et al. ................. 216/12 |
| 5,139,610 | A | | 8/1992 | Dunaway et al. |
| 5,326,426 | A | * | 7/1994 | Tam et al. ...................... 216/12 |
| 5,759,625 | A | | 6/1998 | Laubacher et al. |
| 5,876,880 | A | * | 3/1999 | Vonach et al. ................... 430/5 |
| 5,953,585 | A | | 9/1999 | Miyaguchi |
| 6,214,631 | B1 | * | 4/2001 | Burrows et al. ............... 438/22 |
| 6,331,356 | B1 | | 12/2001 | Angelopoulos et al. |
| 6,331,701 | B1 | * | 12/2001 | Chen et al. .................. 250/251 |
| 6,949,879 | B1 | | 9/2005 | Wright et al. |
| 7,175,773 | B1 | * | 2/2007 | Heidemann et al. ........... 216/24 |
| 2002/0141036 | A1 | * | 10/2002 | Jin et al. ...................... 359/291 |
| 2003/0124245 | A1 | * | 7/2003 | Sakaguchi .................... 427/66 |

(Continued)

FOREIGN PATENT DOCUMENTS

JP 56-125856 A 10/1981

(Continued)

*Primary Examiner*—Allan Olsen
(74) *Attorney, Agent, or Firm*—Howson & Howson LLP

(57) ABSTRACT

A method of removing an organic, preferably polymeric, light-emitting material (4) from defined areas of a substrate (1) comprises the steps of arranging a shadow mask (5) to overlie the organic material other than in the defined areas, and applying a beam of ions (7) to the defined areas through the mask. The method is useful in forming organic light-emitting diode arrays.

20 Claims, 1 Drawing Sheet

U.S. PATENT DOCUMENTS

| | | |
|---|---|---|
| 2003/0136679 A1 * | 7/2003 | Bohn et al. .................. 204/543 |
| 2003/0156794 A1 * | 8/2003 | Oh et al. ........................ 385/43 |
| 2004/0012016 A1 | 1/2004 | Underwood et al. |
| 2004/0026367 A1 * | 2/2004 | Goebel et al. .................. 216/59 |
| 2004/0037949 A1 | 2/2004 | Wright |
| 2004/0070334 A1 | 4/2004 | Buckley et al. |
| 2004/0097161 A1 | 5/2004 | Gourlay |
| 2004/0101819 A1 * | 5/2004 | Montemagno et al. ......... 435/4 |
| 2006/0006798 A1 | 1/2006 | Buckley |
| 2006/0099731 A1 | 5/2006 | Buckley et al. |
| 2008/0019652 A1 * | 1/2008 | Steenblik et al. ............ 385/131 |

FOREIGN PATENT DOCUMENTS

| | | |
|---|---|---|
| JP | 56-130926 A | 10/1981 |
| JP | 58-114428 A | 7/1983 |
| JP | 60-033501 A | 2/1985 |
| JP | 11-074084 A | 3/1999 |
| JP | 11-167987 A | 6/1999 |
| JP | 2000-192224 A | 7/2000 |
| WO | 95/34096 A1 | 12/1995 |

* cited by examiner

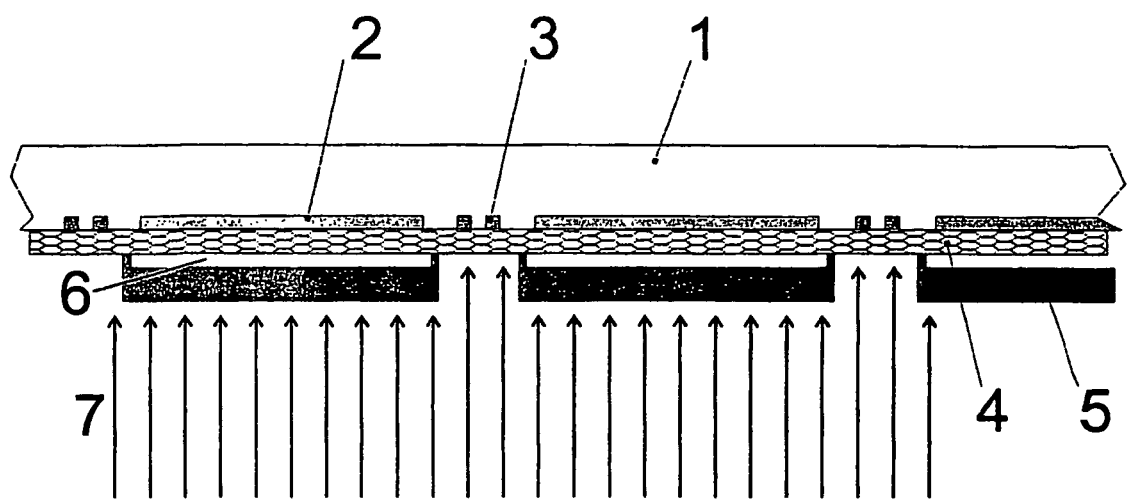

ION BEAM METHOD FOR REMOVING AN ORGANIC LIGHT EMITTING MATERIAL

BACKGROUND TO THE INVENTION

The present invention relates to a method of selectively removing an organic light-emitting material from a substrate in order to leave the material on the substrate in a defined pattern only.

Any such method must not damage the bulk or interface of the organic material that is required. Thus, in general, photolithography cannot be used.

A particular application of the method is in the formation of arrays of organic light emitting diode (OLED) pixels. Layers of polymeric material may be required in such pixels, for example, light emitting polymers themselves or layers of electrically conducting polymer forming part of an electrode. It is known to form the layers in a desired pattern by coating an entire area of the substrate with the polymeric material and then removing the material from those regions where it is not required. One known removal method is to use laser photoablation. However, a disadvantage of laser photoablation is that particles of removed material thrown up by the photoablation process tend to fall back on to the substrate at unwanted locations.

SUMMARY OF THE INVENTION

With the aim of alleviating these disadvantages, the present invention provides a method of removing an organic light-emitting material from defined areas of a substrate comprising the steps of arranging a shadow mask to overlie the organic material other than in the defined areas, and applying a beam of ions to the defined areas through the mask.

In a particular embodiment of the invention, in order to prevent damage by the mask of particular areas of the organic material, at least one of the mask and the substrate has recesses in its surface facing the other of the mask and the substrate.

The ions may be chemically reactive with the organic material to be etched in order to selectively etch the material and increase etch rate. The ions may be ions of a normally inert gas such as Argon.

The method may be carried out in a vacuum such that the removed organic material does not redeposit on the substrate. In particular, the pressure may be such that the mean free path of the ions is greater than or equivalent to the dimensions of the chamber in which the method is performed so that the process is collision free. For example, the pressure may be less than $5 \times 10^{-4}$ mbar.

The organic light-emitting material is preferably a polymeric material and may comprise at least one layer of an array of diodes to be formed on the substrate. For example, the organic material to be removed may be that covering a bond pad region of the substrate.

In a particular embodiment, the method further comprises using the beam of ions to remove a layer of electrically conducting polymeric material in the defined areas.

Another embodiment of the inventive method comprises a method of removal of at least one organic light emitting diode pixel from an array of organic light emitting diode pixels. This is useful in circumstances in which a pixel is found to be faulty and requires replacement.

BRIEF DESCRIPTION OF THE DRAWING

In order that the invention may be more readily understood, the invention will now be described in more detail, by way of example only, with reference to the accompanying drawing, the single FIGURE of which shows in schematic section a substrate undergoing removal of polymeric material according to an embodiment of the invention.

DETAILED DESCRIPTION OF A PARTICULAR EMBODIMENT

The drawing shows a substrate 1, such as a silicon substrate defining active circuitry (not shown) for controlling an array of OLED pixels 2. Bond pads 3 are located between the arrays 2. A layer of polymeric light-emitting material 4 has been coated over the entire substrate 1 and it is desired to remove the polymeric material from the region of the bond pads 3 but not from the arrays 2.

A hard shadow mask 5 having openings corresponding to the regions of the bond pads 3 is placed on the substrate 1. In order to avoid scraping or gouging of the desired polymeric material 4 by the mask 5, the latter has recesses 6 so that it does not actually contact the polymeric material in the region of the arrays 2.

A beam 7 of Argon ions accelerated from a plasma in a chamber is then caused to impinge on the masked substrate 1. The beam can be spatially neutralised to reduce the static charging of the substrate by use of a neutralising beam of electrons emitted from a cathode. The spatially neutral ion beam removes the polymeric material in the regions of the bond pads 3 but not in the masked regions. The vacuum under which the process is operated is such that the unwanted removed polymeric material is deposited on the walls of the vacuum system. The vacuum system is typically under sufficiently reduced pressure such that there are no collisions between individual gas ions within the ion beam and as a consequence the etching effect of the beam is directional.

According to an embodiment of the invention, it is possible to etch most commercially available polymer OLED and conducting polymer materials at the same time.

In a particular example, a layered stack comprised Lumation® White 1100, a polyfluorene based light-emitting polymer, supplied by Dow Chemical Company, approximately 80 nm thick, and an underlying layer of Baytron® P CH 8000, an aqueous dispersion of poly(3,4-ethylenedioxythiophene) poly(styrenesulfonate), supplied by HC Starck, approximately 70 nm thick. These layers could be etched within 20 minutes using a Veeco ion beam source drawing 250 mA current and operating in a vacuum chamber with a throw distance of approximately 30 cm between the ion source and the substrate. The chamber was at a reduced pressure of $4 \times 10^{4}$ mbar and the ion beam cone was shaped through a sector mask to reduce thermal warming of the substrate having the layers. During the etch process, the substrate and the close-proximity mask were rotating, exposing a portion of the substrate and the layered material to the ion beam through the sector mask. This led to efficient etching of the polymer layers in the desired areas.

Using this method it has been possible to etch a variety of layer thicknesses of Lumation White 1100 and Baytron P CH 8000. The method has also been applied to the etch of other Dow Chemical Lumation light-emitting polymers, including Red 1100, Green 1300 and Blue 1100, and also in combination with other layers of Baytron P CH 8000 and Baytron P 4083. It was observed that light-emitting polymer. layers etch faster than the conducting polymer layers, resulting in a shorter process time.

The invention could also be used in the repair of large scale OLED pixel arrays, i.e. those fabricated by ink-jet printing go the pixels. By aligning a suitable mask, polymeric material could be removed from such arrays and replaced at an early stage in the fabrication of a product. Preferably, faulty pixels would be identified and repaired without activation ("lighting up") of the array.

All forms of the verb "to comprise" used in this specification have the meaning "to consist of or include".

The invention claimed is:

1. A method of removing an organic light-emitting material from defined areas of a substrate comprising the steps of arranging a shadow mask to contact the substrate and overlie the organic material other than in the defined areas, at least one of the mask and the substrate having recesses in its surface facing the other of the mask and the substrate, and applying a beam of ions to the defined areas through the mask.

2. A method according to claim 1, wherein the ions are chemically reactive with the organic material to be etched.

3. A method according to claim 1, wherein the step of applying the beam of ions is carried out in a chamber having dimensions, at a pressure at which the mean free path of the ions is greater than or equivalent to the chamber dimensions.

4. A method according to claim 1, wherein the step of applying the beam of ions is carried out at a pressure less than $5 \times 10^{-4}$ mbar.

5. A method according to claim 1, wherein the organic material to be removed covers a bond pad region of the substrate.

6. A method according to claim 1, further comprising the step of using the beam of ions to remove a layer of electrically conducting polymeric material in the defined areas.

7. A method according to claim 1, wherein the ions are ions of a normally inert gas.

8. A method according to claim 7, wherein the ions are Argon ions.

9. A method according to claim 1, wherein the organic material is formed from an organic layer of an array of organic light emitting diodes on the substrate.

10. A method according to claim 9, further comprising the step of removing organic material from a least one organic light emitting diode pixel of the array of organic light emitting diodes.

11. A method according to claim 1, wherein said mask does not contact said organic material where said mask overlies said organic material at locations corresponding to said recesses to avoid scraping or gouging of said organic material at said locations.

12. A method according to claim 11, wherein said recesses are formed in the surface of said mask.

13. A method according to claim 1, wherein the organic light-emitting material is polymeric.

14. A method according to claim 13, wherein the ions are chemically reactive with the organic material to be etched.

15. A method according to claim 13, wherein the ions are ions of a normally inert gas.

16. A method according to claim 15, wherein the ions are Argon ions.

17. A method according to claim 13, wherein the step of applying the beam of ions is carried out in a chamber having dimensions, at a pressure at which the mean free path of the ions is greater than or equivalent to the chamber dimensions.

18. A method according to claim 17, wherein the step of applying the beam of ions is carried out at a pressure less than $5 \times 10^{-4}$ mbar.

19. A method according to claim 18, wherein the organic material is formed from an organic layer of an array of organic light emitting diodes on the substrate.

20. A method according to claim 19, wherein the organic material to be removed covers a bond pad region of the substrate.

* * * * *